United States Patent
Ohlhoff et al.

(10) Patent No.: US 7,107,501 B2
(45) Date of Patent: Sep. 12, 2006

(54) TEST DEVICE, TEST SYSTEM AND METHOD FOR TESTING A MEMORY CIRCUIT

(75) Inventors: Carsten Ohlhoff, Münich (DE); Peter Beer, Tutzing (DE)

(73) Assignee: Infineon Technologies AG, Munich (DE)

( * ) Notice: Subject to any disclaimer, the term of this patent is extended or adjusted under 35 U.S.C. 154(b) by 409 days.

(21) Appl. No.: 10/452,485

(22) Filed: Jun. 2, 2003

(65) Prior Publication Data

US 2003/0226074 A1 Dec. 4, 2003

(30) Foreign Application Priority Data

May 31, 2002 (DE) ............................ 102 24 184
Jun. 14, 2002 (DE) ............................ 102 26 584

(51) Int. Cl.
*G11C 29/00* (2006.01)
*G06F 12/00* (2006.01)

(52) U.S. Cl. ..................... 714/723; 711/167
(58) Field of Classification Search ............ 714/718, 714/723, 710, 711, 815, 811, 5, 6, 7, 8, 53, 714/54; 711/154, 167, 100
See application file for complete search history.

(56) References Cited

U.S. PATENT DOCUMENTS

| | | | | |
|---|---|---|---|---|
| 5,946,250 A | * | 8/1999 | Suzuki | 365/201 |
| 6,138,257 A | * | 10/2000 | Wada et al. | 714/724 |
| 6,173,238 B1 | | 1/2001 | Fujisaki | |
| 6,314,536 B1 | * | 11/2001 | Kurosaki | 714/718 |
| 6,442,724 B1 | * | 8/2002 | Augarten | 714/738 |

* cited by examiner

*Primary Examiner*—Christine T. Tu
(74) *Attorney, Agent, or Firm*—Laurence A. Greenberg; Werner H. Stemer; Ralph E. Locher

(57) ABSTRACT

A test device has an interface for connecting a memory circuit that is to be tested and for receiving fault addresses. The test device further has a fault address memory for storing fault addresses and a control unit for allocating the received fault addresses to a fault address which is to be stored. A first sequence of memory cells can be addressed with a first access time, and a second sequence of memory cells can be addressed with a second access time, in the fault address memory. The second access time is longer than the first access time. First fault addresses are received at a first data rate, and second fault addresses are received at a second data rate, via the interface. The second data rate is lower than the first data rate. The control unit stores the first fault addresses in the fault address memory on the basis of the first sequence of memory cells, and stores the second fault addresses in the fault address memory on a basis of the second sequence of memory cells.

10 Claims, 2 Drawing Sheets

TEST DEVICE, TEST SYSTEM AND METHOD FOR TESTING A MEMORY CIRCUIT

BACKGROUND OF THE INVENTION

Field of the Invention

The invention relates to a test device for testing a memory circuit that can be connected to the test device, and to a method for testing a memory circuit.

Large-scale integrated semiconductor memory chips, such as DRAMs, cannot be produced without faults with a sufficient yield. Faults generally include some of the memory cells not operating at all (hard errors) or not operating in certain circumstances (soft errors). Additional so-called redundant memory cells are therefore provided on typical memory chips.

In production, each substrate wafer on which the memory chips are located is subjected to a large number of functional tests, in which faulty memory cells are identified. For this purpose, the external test device must determine the addresses of the faulty cells, and must calculate a repair solution on the basis of the data. The repair solution defines which defective cell should be repaired by which redundant memory cell.

Test devices which are intended to be used for testing large-scale integrated semiconductor memory circuits, such as DRAMs, for this purpose have a so-called fault address memory (bit fail map memory), and a data processing device, by which the redundancy calculation is carried out.

In order to minimize the test costs per component, the memory circuits are increasingly being tested in parallel. In addition, circuits that assist testing, such as built-in self-test (BIST) circuits or data compression circuits, are provided, in order to assist the test procedure.

When using a BIST circuit, the test is controlled completely in the memory module. The repair solution must also be calculated externally when using a BIST circuit. In this case, the fault addresses are transmitted to an external appliance, which stores the faults and calculates a repair solution. When there is a high degree of parallelity and the memory densities are high, for example 512 Mbits per module, this transmission and the storage represent a capacity problem. For example, a fault address memory with a size of about 2 Gbytes is required for parallel testing of 128 256 Mbit memory circuits. The exact size depends on the achievable redundancy-conformal compression. In order to make it possible to store the fault addresses in real time even at test frequencies of more than 60 MHz, it is therefore necessary to use a faster, and hence also very expensive, SRAM memory.

The use of DRAM memory as a fault address memory has the disadvantage that more DRAM memory is required in order to allow the necessary memory rates for random access. The greater amount of memory is necessary because the memory banks normally have to be addressed alternately, in order to conceal the dead times which result from refresh cycles or from changing the word line address. The advantage that is achieved by the use of DRAM memory as a fault address memory, namely that there is no need for the faster and more expensive SRAM memories, is thus cancelled out again since a considerably greater amount of memory is required when using DRAM memories. Furthermore, when using a large amount of memory, problems may arise from the power consumption in the test system.

U.S. Pat. No. 6,173,238 B1 discloses a fault address memory formed from DRAM memories. In this case, an interleaving method is used to shorten the access time.

In order to allow the use of DRAM memory as a fault address memory, the test can alternatively be carried out at lower read frequencies that, for example, are governed by the access times to the DRAM memory. However, this lengthens the test time.

SUMMARY OF THE INVENTION

It is accordingly an object of the invention to provide a test device, a test system and a method for testing a memory circuit that overcomes the above-mentioned disadvantages of the prior art devices and methods of this general type, in which low-cost DRAM modules or other memories which may require dead times during the storage process can be used to form a fault address memory, without needing to accept major restrictions to the test frequency. A further object of the present invention is to provide a method that allows the use of DRAM memory or a similar memory for testing memory modules, without needing to reduce the test speed.

With the foregoing and other objects in view there is provided, in accordance with the invention, a test device. The test device contains an interface for connecting to a memory circuit to be tested and for receiving fault addresses, a fault address memory having memory cells for storing the fault addresses, and a control unit connected between the interface and the fault address memory. The control unit allocates and stores the fault addresses at an address in the fault address memory. A first sequence of the memory cells in the fault address memory can be addressed with a first access time, and a second sequence of the memory cells can be addressed with a second access time. The second access time is longer than the first access time. First fault addresses of the fault addresses can be received at a first data rate, and second fault addresses of the fault addresses can be received at a second data rate, through the interface, with the second data rate being lower than the first data rate. The control unit stores the first fault addresses in the fault address memory on a basis of the first sequence of the memory cells, and stores the second fault addresses in the fault address memory on a basis of the second sequence of the memory cells.

According to one aspect of the present invention, the test device has an interface for connecting to the memory circuit to be tested and for receiving fault addresses, a fault address memory for storing fault addresses, and a control unit for allocating the received fault addresses to an address in the fault address memory. A first sequence of memory cells can be addressed with a first access time, and a second sequence of memory cells can be addressed with a second access time, in the fault address memory. The second access time is longer than the first access time. First fault addresses can be received at a first data rate, and second fault addresses can be received at a second data rate, via the interface. The second data rate is lower than the first data rate. The control unit is configured to store the first fault addresses in the fault address memory on the basis of the first sequence of memory cells, and stores the second fault addresses in the fault address memory on the basis of the second sequence of memory cells.

The present invention is based on the idea that it is possible to use as a fault address memory a memory which is subject essentially to the same restrictions (refresh cycles, longer access time when changing the word line) for read and write accesses as the memory to be tested. The fault address memory is driven by the control unit such that, in the case of fault addresses which are received in the test device and follow one another quickly, the sequence of data is stored in the fault address memory such that this has only a short access time, in the case of DRAM memory, for example, along the memory cells of a word line. If the data rate of the received fault addresses is lower, then the control unit decides that the fault addresses will be stored in the fault address memory in a sequence that requires a longer access time.

This results in the major advantages that the amount of memory in the test device can be minimized, that is to say the same size can essentially be provided for the memory size of the fault address memory as the size of the connected memory circuits to be tested.

A further advantage is that a low-cost standard memory can be used for the fault address memory, so that there is no need to use SRAM memory modules that are normally provided for use as a fault address memory.

High read rates can be achieved during testing which are considerably above the times for random read and write accesses in DRAM memory components.

A further advantage is that the use of standard memory modules results in that fault address memories can be upgraded at low cost.

When testing DRAM memory circuits, data is first written to the memory matrix, and fault addresses are then read. The fault addresses result from a comparison between written data and data that is stored in the memory matrix, with the fault addresses indicating the memory position at which a difference, that is to say a fault, exists between the written data and the read data. A fault is normally represented by a logic "1", and an intact memory cell by a logic "0".

As a result of the construction of a DRAM memory as a memory matrix, the access rates for addresses along a word line "a so-called page" are typically faster by a factor of 5–20 than for addresses on different word lines. While the access rates for the addresses along a word line typically match the frequency, or twice the frequency (in the case of DDR memories), the times for different word lines (equivalent to different X addresses) are governed by the row access time (row cycle time) (TRC) that, for present-day module types, is in the region of 7–10 clock cycles.

Fault addresses must be stored whenever a read access is made to the tested memory. With present-day memory architectures for fault address memories, the memory area of the fault address memory is subdivided without taking into account the difference between X and Y addresses, that is to say between word line and bit line addresses.

Therefore, the entire memory system must be configured completely for the situation of maximum read rates, that is to say the access time to each memory cell in the fault address memory must correspond at least to the shortest access time to a memory cell in the memory module to be tested. When using a buffer store, for example, the mean access time must be at least sufficiently short to allow the fault addresses to be stored at the average data rate of the fault addresses, without any loss of data and without the buffer store overflowing.

In the case of the invention proposed here, the memory is subdivided such that the addresses that lie on one word line (page) in the memory to be tested lie essentially on one word line in the fault address memory as well. Thus, if maximum fault address rates occur when reading one page, these can also be stored at high speed in the fault address memory of the test device. If different X addresses, that is to say word line addresses, are accessed in the memory to be tested, the rates at which fault addresses have to be stored are considerably lower. It is then also possible to store these in fault address memories on different pages (X addresses). Overall, this allocation process is controlled by the control unit.

It is also possible to provide for the fault address memory to be configured such that the first access time is matched to the first data rate of the fault addresses, and the second access time is matched to the second data rate of the fault addresses, in order to store the first fault addresses and the second fault addresses without any delay.

A data buffer is preferably provided, and is connected to the fault address memory in order to buffer store the fault addresses that are received via the interface before these are written to the fault address memory. This makes it possible to bridge delays in the writing of data to the fault address memory as may occur, by way of example, as a result of a refresh cycle.

It is also possible to provide for the control unit to have a counter which counts the number of fault addresses to be written in one section of the fault address memory, with the control unit being configured such that the storage of possible further fault addresses in the same section is stopped when the counter indicates a predetermined number of faults in that section. If more than a predetermined number of faults occur along one word line or bit line, the entire bit line or the entire word line is replaced by a redundant bit line or word line, respectively. In this case, it is irrelevant how many more faults occur on this word line once a specific number of faults has been reached on the word line. This makes it possible to save further time for writing to the fault address memory, since the storage process is stopped on reaching the maximum number of faults for one word line or bit line. If a specific number of faults is exceeded, beyond which the memory module is no longer repairable, then no further writing of fault addresses to the fault address memory takes place in the rest of the test procedure.

According to a further aspect of the present invention, a test system is provided which has a test device according to the invention, and a memory circuit that is connected to the interface of the test device. A first address in the memory circuit is addressed with a first access time; a second address in the memory circuit is addressed with a second access time. The first data rate at which the fault addresses are transmitted to the test device in this case depends on the first access time, and the second data rate depends on the second access time.

According to a further aspect of the present invention, a method is provided for testing a memory circuit, in which faults that occur are stored as fault addresses in a fault memory. In this case, first fault addresses are output from a memory circuit that is to be tested on the basis of a first access time, and second fault addresses are output on the basis of a second access time. A first sequence of memory cells can be addressed with a third access time, and a second sequence of memory cells can be addressed with a fourth access time, in the fault address memory. The second access time is longer than the first access time, and the fourth access time is longer than the third access time. The first fault addresses, which are read with a first access time, are stored on the basis of the first sequence of memory cells, and the second fault addresses, which are read with a second access time, are stored on the basis of the second sequence of memory cells.

The method according to the invention has the advantage that the test frequency can be increased when using a DRAM memory as the fault address memory in a test device, with the different access times for the fault address memory and for the memory circuit which is to be tested being matched to one another.

Other features which are considered as characteristic for the invention are set forth in the appended claims.

Although the invention is illustrated and described herein as embodied in a test device, a test system and a method for testing a memory circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Typical memory modules (standard DRAMs) have 16 or more data inputs and outputs and have four independently operating banks. If a BIST circuit or at least one chip-internal data production is used for the memory test, up to 64 data items can be processed (that is to say read or written) in parallel. Faster DRAM architectures such as DDR1 and DDR2 also have a data prefetch with 2 or 4 bits. Therefore, the module operates internally at twice or four times the data bus width. In the case of a DDR2 module with an X16 organization, at least 64 bits are written or read in parallel for each bank in each internal cycle.

In order to reduce the amount of data that is transmitted externally, the addresses of the faulty cells can first be compressed in a redundantly conformal manner within the memory. In this case, redundancy conformal refers to the fact that the compression is irrelevant to the subsequent calculation of the repair solution, even though some information is lost.

Figure 1:
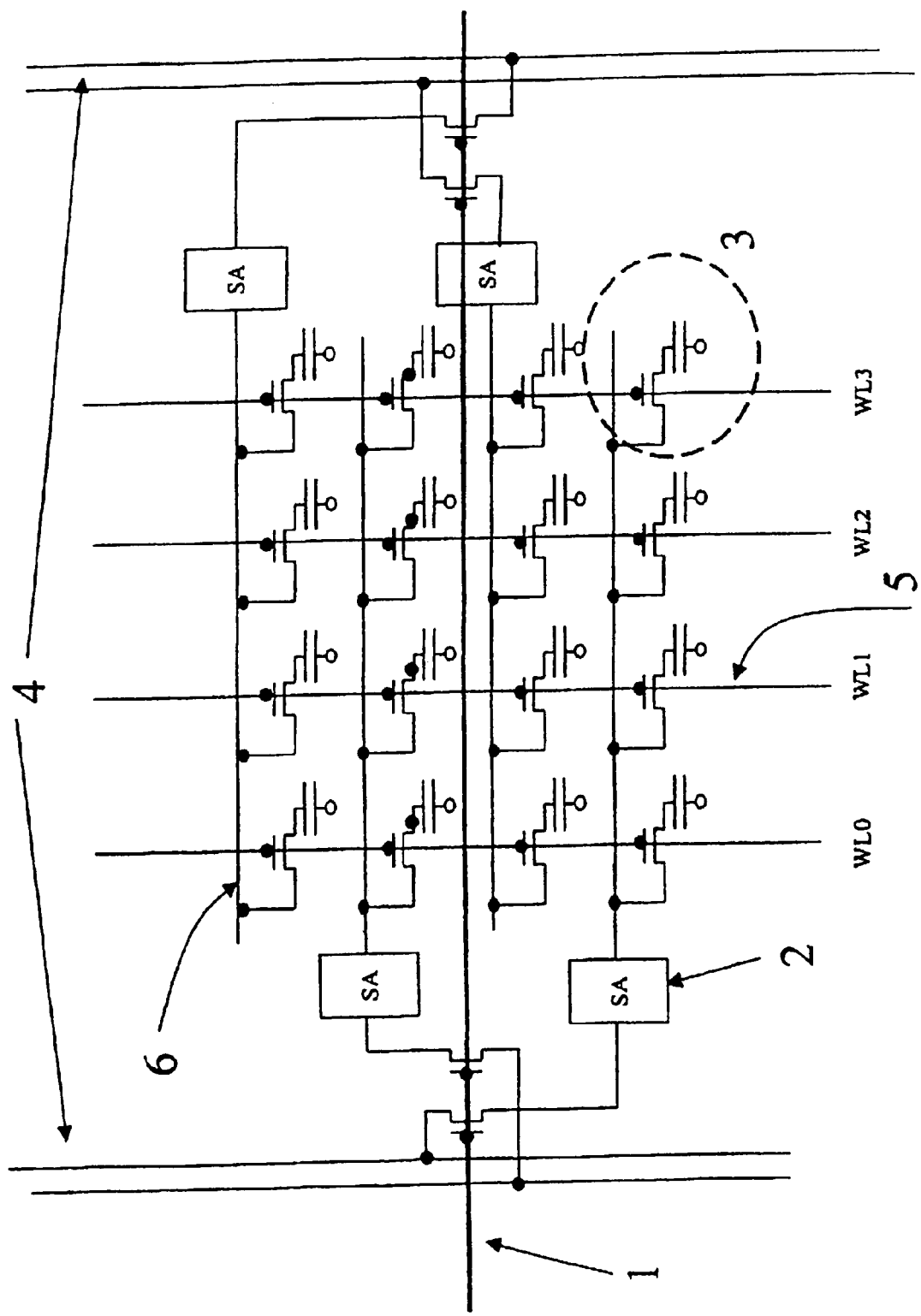
FIG. 1 is a circuit diagram of a detail of a memory matrix of a DRAM memory circuit.

The redundancy conformal compression is governed by the configuration of the memory module. For example, in order to save signal lines, individual bits are not driven in the memory field, but, for example, are read or written in groups of 4 bits in each case. This is illustrated in the form of an example in FIG. 1. FIG. 1 shows, schematically, a detail of a typical DRAM memory cell array containing 4×4 single transistor cells 3. A column selection line 1 connects read amplifiers 2 simultaneously to in each case four cells 3 on adjacent bit lines 6 along a word line 5. The use of a redundant column selection line for a repair correspondingly also allows only defective groups of four bit lines to be replaced by intact redundant lines. No information that is relevant for repair is therefore lost by the compression of the information about which of the 4-bit lines a given fault is located on.

If more faults occur along a column selection line than there are redundant rows, then this is referred to as a column must fail. Therefore, the faults must in any case be repaired by a redundant column selection line. In a corresponding way, a row must fail occurs when more faults occur along a row (word line) than there are redundant columns. A so-called must fail criterion is thus defined by the number of redundant elements in the X and Y directions. Fault addresses along a row or column beyond the must fail criterion do not contain any more relevant information for the redundancy calculation.

Even after redundancy conformal compression, the data rates to be transmitted are still considerable. In practice, there are different approaches as to how the data can be transmitted to the external tester in order to be stored in a fault address memory there. A fault address memory essentially represents a map of the memory circuit to be tested in which, for example, each address which is identified as being faulty is marked by a logic "1", that is to say an individual cell or cell area. In a corresponding way, if only logic "0"s were stored in an area of the fault address memory associated with the memory circuit to be tested, this would correspond to the memory circuit to be tested being fault-free.

It is irrelevant for the present invention whether the fault addresses are transmitted in compressed or uncompressed form to the fault address memory.

Figure 2:
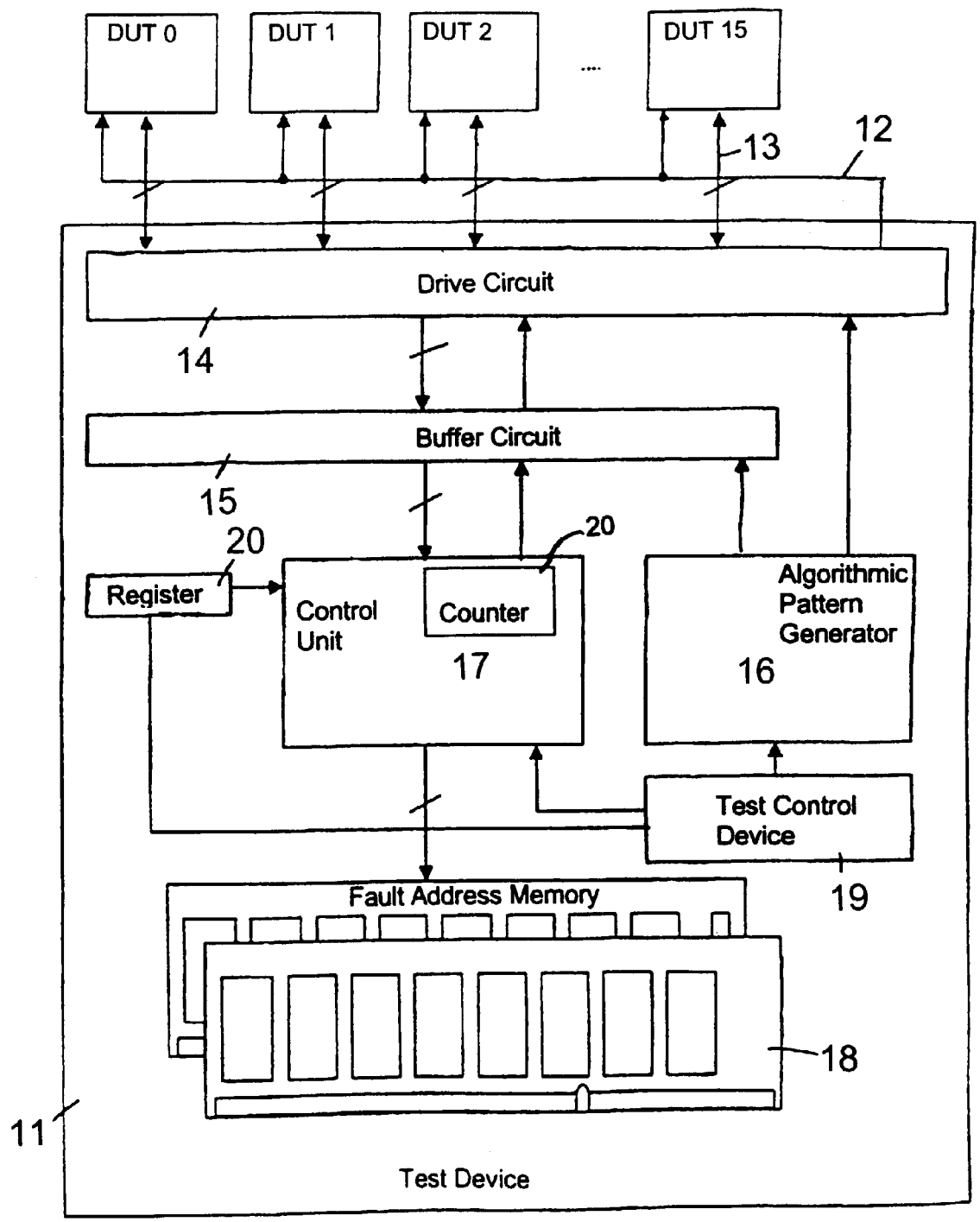
FIG. 2 is a block diagram of a test system according to the invention, based on one embodiment of the invention.

FIG. 2 shows a test system according to the invention with a test device 11. 16 memory modules DUT0–DUT15 that are to be tested in parallel are connected to the test device 11. The memory circuits DUT0–DUT15 that are to be tested are connected to the test device 11 via command and address lines 12, and via data lines 13. These represent an interface between the memory modules DUT0–DUT15 that are to be tested and the test device 11.

As an interface, the test device 11 has a drive circuit 14 that is connected to the data lines and to the command and address lines 12. The function of the drive circuit 14 is to comply with a communication protocol for communication with the memory circuits that are to be tested, and to provide adequate timing. The drive circuit 14 transmits the received fault addresses to a buffer circuit 15.

The drive circuit 14 is connected to an algorithmic pattern generator (ALPG) 16. The pattern generator 16 produces input signals for the drive circuit 14 from addresses, commands and data. The drive circuit 14 transmits these input signals via the data lines 13 and the command and address lines 12 to the memory circuits DUT0–DUT15 that are to be tested. The read data is compared in the receiving section of the drive electronics 14 with the expected read data from the algorithmic pattern generator 16 whenever a corresponding data strobe is programmed in the timing. On this basis, an assessment is carried out, the fault addresses are determined and the result is then written to the buffer store 15.

The fault addresses are written to a fault address memory 18 as an update. Since a memory circuit is tested repeatedly using different test patterns, the fault addresses must be added to the already previously stored fault addresses. Renewed writing to a fault address memory 18 would otherwise lead to loss of information relating to faults which had already occurred.

The buffer store 15 is connected to a control unit 17, which controls the storage of the fault addresses in the fault address memory 18 that is connected to it.

The function of the buffer store 15 is to decouple the data storage in the fault address memory 18 in time from the production in the drive circuit 14. This is necessary when a DRAM-based memory is used as the fault address memory. The buffer store 15 makes it possible to decouple the timing between the received data and the storage of the fault addresses. This is necessary in order first to open a new word line, page, in the fault address memory when required, if necessary to carry out a refresh in the fault address memory to the end, before a fault address update, that is to say to make it possible to update the already stored fault addresses with the new fault addresses.

It may also be necessary to decouple the clock domains, that is to say the different clock frequencies on the clock buses in the test device 11 and at the memory modules DUT0–DUT15 that are to be tested. Therefore, when necessary, it is always possible to operate the test device 11 at the maximum frequency, while the test patterns can be passed to the memory modules DUT0–DUT15 to be tested, with the reading process thus being carried out at a frequency that corresponds to the test requirements. For this reason, the algorithmic pattern generator 16 is connected to the buffer store 15, in order to transmit the current address, which is generated in the algorithmic pattern generator 16, to the data buffer. This is necessary since the algorithmic pattern generator 16 must be operated at the same test frequency as the memory modules that are to be tested. The fault addresses on the drive circuit 14 can thus be combined in the buffer store 15 to form a fault address. The control unit 17 thus receives only complete fault addresses from the buffer store 15, depending on the clock frequency available from the test device 11.

The following text assumes that the memory modules DUT0–DUT15 which are to be tested have an effective address area of 16M×4 (for example 256 Mbits with 4:1 data compression), which is intended to be tested, including redundant elements. As shown in the following table, the module has nine Y addresses and thirteen X addresses. In addition to this, there is in each case one further address (XR, YR) for the redundant columns and rows (equivalent to bit lines and word lines), which are intended to be used to repair any faults subsequently. B0 and B1 are the bank addresses. The 16 memory modules that are tested in parallel have a total of 64 inputs/outputs. The fault addresses that result from this must be stored individually.

The table likewise shows the address allocation for the fault address memory 18. In this case, it is assumed that this consists of two commercially available two-bank DIMMs, which can be switched between by use of the /CS (CS0, CS1). The important factor for the present invention is that the Y addresses of the modules that are to be tested are also on one page in the DIMMs. If the memory circuit is now read as part of a functional test, then the read addresses are transmitted not only to the module but also to the control unit 17. The control unit 17 is configured such that the pages in the fault address memory 18 remain open, that is to say the word line remains activated, until the control unit 17 receives a new X address from the algorithmic pattern generator 16. Only then is the word line deactivated, with the page thus being closed. This ensures that the fault information can be stored sufficiently quickly for rapid access along a page of the memory module DUT0–DUT15 that is to be tested. If it is not possible to layout the fault address memory 18 such that all the Y addresses of the memory module that is to be tested can be mapped onto one page, then it is also feasible to subdivide it between a small number of pages. The time that is additionally required in this case for the deactivation and activation of the respective next word line in the fault address memory 18 must in this case be covered by the data buffer 15. In this situation, the control unit 17 must be configured such that not only the X address but also the most significant Y addresses, as well, are evaluated.

TABLE

| Address allocation between the tested memory (DUT) and the fault bit map memory (standard DIMMs) | | | | | | | | | | | | | | | | |
|---|---|---|---|---|---|---|---|---|---|---|---|---|---|---|---|---|
| 16 DUT | dq53-0 | b1 | b0 | xR | x12 | x11 | x10 | x9 | x8 | x7 | x6 | x5 | x4 | x3 | x2 | x1 | x0 |
| | Data lines | x-addresses (slow access) | | | | | | | | | | | | | | |
| Fault bit map | dq53-0 | cs1 | cs0 | b1 | b0 | | x11 | x10 | x9 | x8 | x7 | x6 | x5 | x4 | x3 | x2 | x1 | x0 |
| | yR | y8 | y7 | y6 | y5 | y4 | y3 | y2 | y1 | y0 | | | | | | |
| | y addresses (fast access) | | | | | | | | | | | | | | | |
| | y9 | y8 | y7 | y6 | y5 | y4 | y3 | y2 | y1 | y0 | | | | | | |

Since it takes a certain amount of time to close and open the page, the incoming fault addresses are buffer-stored in the data buffer 15 during this time. Possible backlogs can be overcome in times in which no new fault addresses occur, for example because a page in the memory component which is to be tested is closed, or a write access is taking place.

In the case of DRAMs, a refresh cycle is required at periodic time intervals. This severely restricts its use in systems in which the data must be stored in real time. The problem in the present situation for use in the test device 11 is solved by the control unit 17 using times in which no reading takes place for refreshment, with these occurring in every memory test. These times in which no reading takes place occur, for example, when the component which is to be tested is being written to, when operating parameters are being modified, or when a refresh cycle is being carried out. It is also possible to use the buffer store to carry out refresh accesses within a read sequence, while the fault addresses are being read from the components DUT0–DUT15 that are to be tested.

In order furthermore to prevent the data buffer 15 from overflowing in response to critical test patterns (for example in the case of long read sequences), the test frequency should be chosen such that it is lower than the frequency at which the control unit 17 drives the fault address memory 18. The various clock systems can in this case be decoupled via the data buffer 15. The resultant timing restrictions are considerably less with this approach than with a system with arbitrary address allocation.

Normally, the memory modules DUT0–DUT15 which are to be tested are written to and read from successively and repeatedly, with the fault addresses being accumulated, that is to say the received fault addresses are added to the already evaluated fault addresses, so that faults which have already been identified are still stored in the fault address memory 18. A further improvement in the efficiency for this so-called update of the fault address memory is achieved by using the must fail criterion as described above. In some of the test runs, the addresses are passed through in such a way that all the X addresses are accessed first, before the Y address is incremented (fast X) in an outer loop. If all the Y addresses are accessed first, before the X address is incremented in an outer loop, this is referred to as a fast Y pattern.

If, as described, the memory module which is to be tested has the fast X or fast Y test pattern written to it and is then read from, the control unit 17 can be configured such that the number of faults along a column (fast X) or row (fast Y) are also counted, and no further fault address updates, that is to say adding of the fault addresses to the already received fault addresses, are carried out for the memory component which is to be tested and for which the number of faults has exceeded the must fail criterion.

In order to make it possible to achieve the reduction described here in the fault address updates, a test control device 19 is provided, which is connected to the algorithmic pattern generator 16 of the control unit 17 and to a programmable register 20. The must fail criterion in the programmable register 20 is made available to the control unit 17. The register 20 is programmable in order to allow a suitable must fail criterion to be defined for each test individually, for example as a function of the address scheme (fast X or fast Y test pattern). The must fail criterion represents a number of faults that have occurred, beyond which the control unit 17 prevents further writing along the fast X and fast Y addresses.

With the procedure described here, it should be remembered that faults can occur at different addresses for the memory modules DUT0–DUT15 which are tested in parallel. Thus, in the worst case, n×m fault address updates must be carried out for each row (word line) or column (bit line), where n corresponds to the number of memory components to be tested, that is to say 16 in the chosen example, and m is equal to the number of faults occurring for the must fail criterion.

As a modification to the present example, a BIST circuit (Built-in Self Test) could also be used to produce the test pattern data in the memory components that are to be tested. In this case, there are two possible ways to make the address information that is required to construct the fault addresses available for the control unit 17. Either a so-called shadow pattern is produced in the test device 17, in particular in the algorithmic pattern generator 16, whose only purpose is to make the addresses available to the control unit 17, or a format or protocol which also includes the address information must be chosen for transmitting the fault addresses from the memory component DUT0–DUT15 which is to be tested.

It is also possible to provide for the control unit 17 to have a counter 20 which counts the number of fault addresses to be written in one section of the fault addresses, with the control unit 17 being configured such that the storage of possible further fault addresses in the same section is stopped when the counter 20 indicates a predetermined number of faults in that section.

The invention concept proposed here can also be applied to other memory types which are essentially constructed in the form of matrices and, by virtue of their architecture, have a considerable different access time, depending on the manner in which they are addressed.

We claim:

1. A test device, comprising:
   an interface for connecting to a memory circuit to be tested and for receiving fault addresses;
   a fault address memory having memory cells for storing the fault addresses; and
   a control unit connected between said interface and said fault address memory, said control unit allocating and storing the fault addresses at an address in said fault address memory, a first sequence of said memory cells in said fault address memory can be addressed with a first access time, and a second sequence of said memory cells can be addressed with a second access time, the second access time being longer than the first access time, first fault addresses of the fault addresses can be received at a first data rate, and second fault addresses of the fault addresses can be received at a second data rate, through said interface, with the second data rate being lower than the first data rate, said control unit storing the first fault addresses in said fault address memory on a basis of said first sequence of said memory cells, and storing the second fault addresses in said fault address memory on a basis of said second sequence of said memory cells.

2. The test device according to claim 1, wherein said fault address memory is configured such that the first access time is matched to the first data rate of the fault addresses, and the second access time is matched to the second data rate of the fault addresses for storing the first fault addresses and the second fault addresses without any delay.

3. The test device according to claim 1, further comprising a data buffer connected to said interface and coupled to said fault address memory, said data buffer buffer-storing the fault addresses received through said interface.

4. The test device according to claim 1, wherein said control device has a counter which accumulates a number of faults indicated in one section of the fault addresses, and said control unit is configured to stop a storage of the fault addresses in said fault address memory for subsequent fault addresses in that section when said counter indicates a predetermined number of faults in the section.

5. The test device according to claim 1, wherein said memory cells are disposed on a basis of said first sequence along a row line.

6. The test device according to claim 1, wherein said memory cells are disposed on a basis of said second sequence along a column line.

7. The test device according to claim 1, wherein said memory cells are disposed on a basis of said first sequence along a row line, and said memory cells are disposed on a basis of said second sequence along a column line.

8. A test system for testing a memory circuit, comprising:
   a test device, containing:
      an interface for connecting to the memory circuit to be tested and for receiving fault addresses;
      a fault address memory having memory cells for storing the fault addresses; and
      a control unit connected between said interface and said fault address memory, said control unit allocating and storing the fault addresses at an address in said fault address memory, a first sequence of said memory cells in said fault address memory can be addressed with a first access time, and a second sequence of said memory cells can be addressed with a second access time, the second access time being longer than the first access time, first fault addresses of the fault addresses can be received at a first data rate, and second fault addresses of the fault addresses can be received at a second data rate, through said interface, with the second data rate being lower than the first data rate, said control unit storing the first fault addresses in said fault address memory on a basis of said first sequence of said memory cells, and storing the second fault addresses in said fault address memory on a basis of said second sequence of said memory cells;

a first address in the memory circuit being addressed using the first access time, and a second address in the memory circuit being addressed using the second access time, the first data rate depending on the first access time and the second data rate depending on the second access time.

9. The test system according to claim 8, wherein the memory circuit is a DRAM memory circuit.

10. A method for testing a memory circuit, which comprises the steps of:
storing faults which occur as fault addresses in a fault address memory;
outputting first fault addresses with a first access time from the memory circuit to be tested; and
outputting second fault addresses with a second access time, a first sequence of memory cells in the fault address memory can be addressed with a third access time and a second sequence of memory cells can be addressed with a fourth access time, the second access time being longer than the first access time, the fourth access time being longer than the third access time, and the first fault addresses being read with the first access time are stored on a basis of the first sequence of memory cells, and second fault addresses being read with the second access time are stored on a basis of the second sequence of memory cells.

* * * * *